(12) United States Patent
Du et al.

(10) Patent No.: US 6,292,684 B1
(45) Date of Patent: Sep. 18, 2001

(54) RESPIRATORY DISPLACEMENT AND VELOCITY MEASUREMENT USING NAVIGATOR MRI ECHO SIGNALS

(75) Inventors: Yiping Du, Towson; Elliot R. McVeigh, Timonium, both of MD (US)

(73) Assignee: GE Medical Systems Global Technology Company, LLC, Waukesha, WI (US)

(*) Notice: Subject to any disclaimer, the term of this patent is extended or adjusted under 35 U.S.C. 154(b) by 0 days.

(21) Appl. No.: 09/460,686

(22) Filed: Dec. 14, 1999

(51) Int. Cl.$^7$ ................................................ A61B 5/055
(52) U.S. Cl. ............................................ 600/410; 324/309
(58) Field of Search .................................. 600/410, 413, 600/419; 324/306, 309

(56) References Cited

U.S. PATENT DOCUMENTS

| | | | |
|---|---|---|---|
| Re. 32,701 | 6/1988 | Moran | 324/309 |
| 4,937,526 | * 6/1990 | Ehman et al. | 324/309 |
| 5,833,609 | * 11/1998 | Dannels et al. | 600/410 |
| 6,037,771 | * 3/2000 | Liu et al. | 324/309 |
| 6,144,874 | * 11/2000 | Du | 600/413 |

OTHER PUBLICATIONS

Respiratory Motion of the Heart: Kinematics and the Implications for the Spatial Resolution in Coronary Imaging, MRM 33:713–719 (1995) Wang, et al.
Adaptive Technique for High–Definition MR Imaging of Moving Structures, Radiology 1989; 173:255–263, Ehman, et al.
Real–Time Motion Detection in Spiral MRI Using Navigators, MRM 32:639–645 (1994), Sachs, et al.
Coronary Arteries: Three–dimensional MR Imaging with Fat Saturation and Magnetization Transfer Contrast, Radiology 1993; 187:401–406, Li, et al.
Algorithms for Extracting Motion Information from Navigation Echoes, MRM 36:117–123 (1996), Wang, et al.
Prospective Adaptive Navigator Correction for Breath–Hold MR Coronary Angiography, MRM 37:148–152 (1997), McConnell, et al.
Reduction of Respiratory Motion Artifacts in Coronary MRA using Navigator Echoes, p. 748, Brummer, et al.
Respiratory Blur in 3D Coronary MR Imaging, MRM 33:541–548 (1995), Wang, et al.
Rapid Scan Magnetic Resonance Angiography, MRM 5, 238–245 (1987), Dumoulin, et al.
A One–Dimensional Velocity Technique for NMR Measurement of Aortic Distensibility, MRM 31:512–520 (1994), Hardy, et al.

* cited by examiner

Primary Examiner—Marvin M. Lateef
Assistant Examiner—Shawna J Shaw
(74) Attorney, Agent, or Firm—Quarles & Brady, LLP; Christian G. Cabou

(57) ABSTRACT

Navigator signals are acquired during a cardiac gated MRI scan to measure the position and velocity components of respiratory motion. Acquired cardiac image views are discarded and/or corrected based on the measurement of the positional and velocity components of respiratory motion to reduce motion artifacts. In one embodiment the navigator pulse sequence includes velocity encoding gradient, and in a second embodiment, velocity is determined by measuring the change in diaphragm position between successive navigator pulse sequences.

22 Claims, 3 Drawing Sheets

RESPIRATORY DISPLACEMENT AND VELOCITY MEASUREMENT USING NAVIGATOR MRI ECHO SIGNALS

BACKGROUND OF THE INVENTION

The field of the invention is nuclear magnetic resonance imaging methods and systems. More particularly, the invention relates to the correction of MRI data acquired during patient motion.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a time varying magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins which may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received NMR signals are digitized and processed to reconstruct the image using one of many well known reconstruction techniques.

The present invention will be described in detail with reference to a variant of the well known Fourier transform (FT) imaging technique, which is frequently referred to as "spin-warp". The spin-warp technique is discussed in an article entitled "Spin-Warp NMR Imaging and Applications to Human Whole-Body Imaging" by W. A. Edelstein et al., Physics in Medicine and Biology, Vol. 25, pp. 751–756 (1980). It employs a variable amplitude phase encoding magnetic field gradient pulse prior to the acquisition of NMR signals to phase encode spatial information in the direction of this gradient. In a two-dimensional implementation (2DFT), for example, spatial information is encoded in one direction by applying a phase encoding gradient ($G_y$) along that direction, and then a signal is acquired in the presence of a readout magnetic field gradient ($G_x$) in a direction orthogonal to the phase encoding direction. The readout gradient present during the acquisition encodes spatial information in the orthogonal direction. In a typical 2DFT pulse sequence, the magnitude of the phase encoding gradient pulse $G_y$ is incremented ($\Delta G_y$) in the sequence of "views" that are acquired during the scan to produce a set of NMR data from which an entire image can be reconstructed.

Most NMR scans currently used to produce high resolution 3D medical images, such as the image of coronary arteries, can require a few minutes to acquire the necessary data. Because of the long scan time, patient movement during the scan may be significant and can corrupt the reconstructed image with motion artifacts. There are also many types of patient motion such as respiratory motion, cardiac motion, blood flow, and peristalsis. There are many methods used to reduce or eliminate such motion artifacts including methods for reducing the motion (e.g. breath holding), methods for reducing the effects of motion (e.g. U.S. Pat. No. 4,663,591), and methods for correcting the acquired data for known motion (e.g. U.S. Pat. No. 5,200,700). In the case of respiratory motion, one of the best known methods for reducing motion artifacts is to gate the acquisition of data such that the views are acquired only during a preset portion, or "acquisition window" of the respiratory cycle.

Prior respiratory gating methods employ a means for sensing patient respiration (e.g. U.S. Pat. No. 4,994,473) and producing a gating signal for the MRI system during a preset portion of the respiratory cycle. As long as the gating signal is produced, the MRI system acquires NMR data in the prescribed view order. During other parts of the respiratory cycle the gating signal is turned off and no data is acquired. As a result, when respiratory gating is used the scan time is increased significantly because data can only be acquired over a relatively short portion of each respiratory cycle.

Rather than acquire NMR data over a relatively short acquisition time, methods are known for acquiring NMR data during subject motion and correcting the data. Such methods often employ a navigator pulse sequence which is interleaved with the acquisition of NMR image data and which is designed to measure subject position. For example, a navigator pulse sequence is disclosed in U.S. Pat. No. 5,363,844 for measuring the position of a patient's diaphragm throughout image data acquisition. This position information may be used as described by T. S. Sachs, et al., "Real-Time Motion Detection in Spiral MRI Using Navigators", Magn. Reson. in Med., 32:639–645 (1994) to reject image data acquired during portions of the respiratory or cardiac cycle which produce unacceptable image artifacts. The position information from a navigator echo signal may also be used prospectively as described by M. V. McConnell, "Prospectively Adaptive Navigator Correction for Breath-hold MR Coronary Angiography", Magn. Reson. in Med., 37:148–152 (1997) to adjust the reference phase of the MRI system receiver to correct the subsequently acquired NMR image data. Or, the navigator signal position information may be used to retroactively correct the phase of acquired k-space image data as described by M. E. Brummer, et al., "Reduction Of Respiratory Motion Artifacts In Coronary MRA Using Navigator Echoes", Proc. International Society of Magnetic Resonance in Medicine, 748 (1995).

More recently it has been discovered that the velocity component of subject motion can produce image artifacts in addition to the position, or subject displacement component. As described by Y. Want, et al., "Respiratory Blur in 3D Coronary MR Imaging", Magn. Reson. In Med., 33:541–548 (1995) both displacement of the heart and its velocity at the moment of image data acquisition can produce artifacts in the reconstructed image.

The measurement of spin velocity using an NMR pulse sequence is well known in the art. The performance of such measurements and the reconstruction of velocity images from acquired NMR data is disclosed in U.S. Patent Re 32,701, issued on Jun. 21, 1988 and entitled "NMR Scanner With Motion Zeugmatography". The measurement of velocity includes the addition of a bi-polar velocity encoding magnetic field gradient to the NMR pulse sequence, and a recognition that the velocity information is contained in the phase of the acquired NMR signals.

SUMMARY OF THE INVENTION

The present invention relates to the acquisition and/or correction of NMR image data in the presence of patient motion, and particularly to the acquisition of navigator echo signal during a scan which enables both the displacement and velocity components of patient motion to be measured. The navigator echo signals are acquired periodically throughout the scan and the measured displacement and velocity components may be used to decide whether to accept or reject acquired NMR image data. The measured displacement and velocity components can also be used to prospectively or retrospectively correct motion artifacts in the acquired NMR image data.

In one preferred embodiment of the invention the navigator echo signals are acquired using a navigator pulse sequence which includes a velocity encoding gradient. The phase difference of the one-dimensional image reconstructed from this velocity encoded navigator signal is a measure of subject velocity and the magnitude of the reconstructed image is indicative of subject displacement.

In another preferred embodiment of the invention navigator echo signals are acquired at known time intervals ($\Delta t$) during the scan. The one-dimensional magnitude images reconstructed from each acquired navigator echo signal is indicative of subject displacement, and the subject velocity during the interval ($\Delta t$) between successive navigator echoes may be calculated from the change in displacement divided by the time interval ($\Delta t$).

DESCRIPTION OF THE PREFERRED EMBODIMENT

Figure 1:
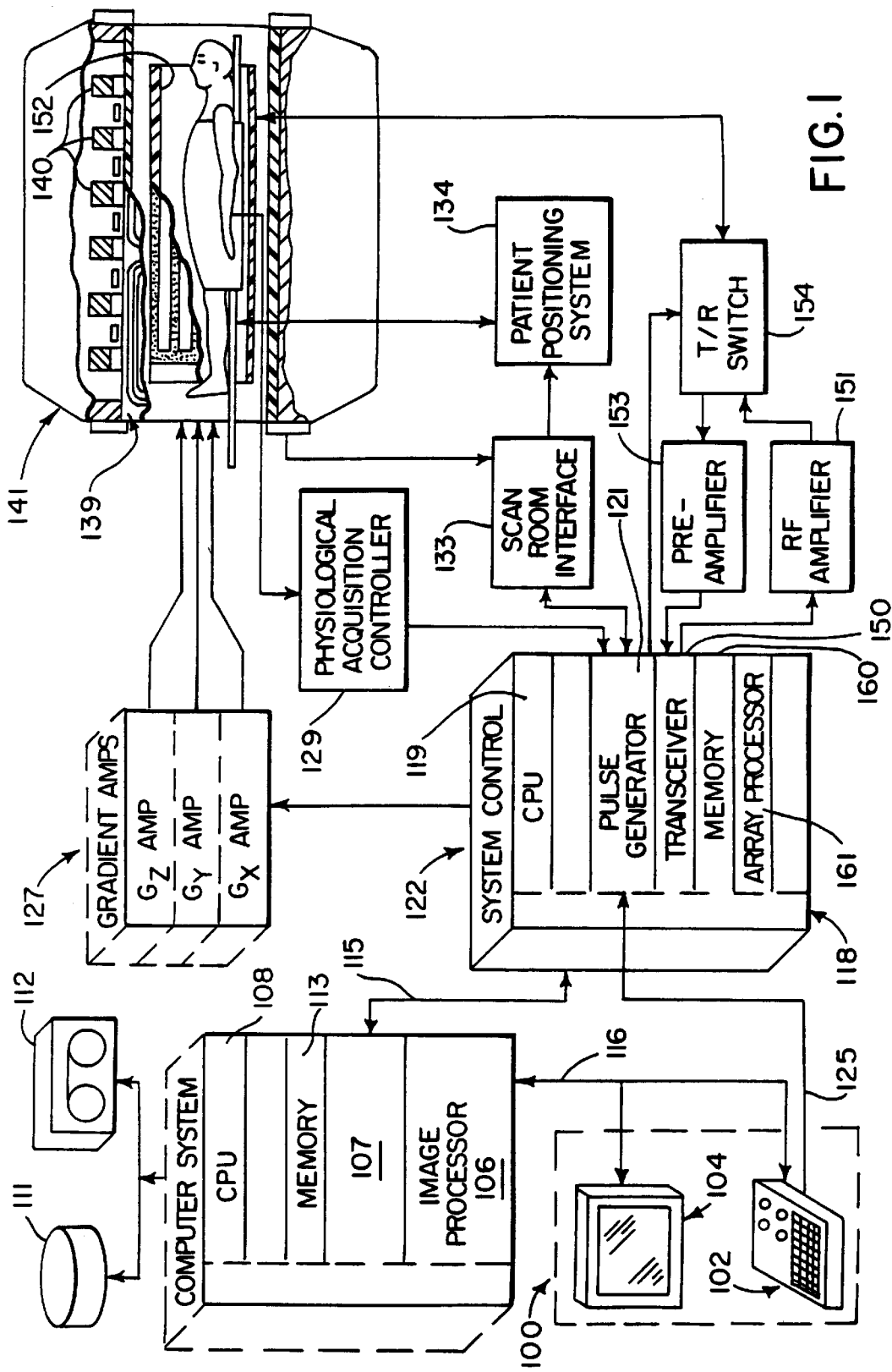
FIG. 1 is a block diagram of an MRI system which employs the present invention.

Referring first to FIG. 1, there is shown the major components of a preferred MRI system which incorporates the present invention. The operation of the system is controlled from an operator console 100 which includes a keyboard and control panel 102 and a display 104. The console 100 communicates through a link 116 with a separate computer system 107 that enables an operator to control the production and display of images on the screen 104. The computer system 107 includes a number of modules which communicate with each other through a backplane. These include an image processor module 106, a CPU module 108 and a memory module 113, known in the art as a frame buffer for storing image data arrays. The computer system 107 is linked to a disk storage 111 and a tape drive 112 for storage of image data and programs, and it communicates with a separate system control 122 through a high speed serial link 115.

The system control 122 includes a set of modules connected together by a backplane 118. These include a CPU module 119 and a pulse generator module 121 which connects to the operator console 100 through a serial link 125. It is through this link 125 that the system control 122 receives commands from the operator which indicate the scan sequence that is to be performed.

The pulse generator module 121 operates the system components to carry out the desired scan sequence. It produces data which indicates the timing, strength and shape of the RF pulses which are to be produced, and the timing of and length of the data acquisition window. The pulse generator module 121 connects to a set of gradient amplifiers 127, to indicate the timing and shape of the gradient pulses to be produced during the scan. The pulse generator module 121 also receives patient data from a physiological acquisition controller 129 that receives signals from sensors connected to the patient. One such signal is an ECG signal which is processed by the controller 129 to produce a cardiac trigger signal for the pulse generator module 121. The pulse generator module 121 also connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$, and $G_z$ amplifiers. Each gradient amplifier excites a corresponding gradient coil in an assembly generally designated 139 to produce the magnetic field gradients used for position encoding acquired signals. The gradient coil assembly 139 forms part of a magnet assembly 141 which includes a polarizing magnet 140 and a whole-body RF coil 152. A transceiver module 150 in the system control 122 produces pulses which are amplified by an RF amplifier 151 and coupled to the RF coil 152 by a transmit/receive switch 154. The resulting signals radiated by the excited nuclei in the patient may be sensed by the same RF coil 152 and coupled through the transmit/receive switch 154 to a preamplifier 153. The amplified NMR signals are demodulated, filtered, and digitized in the receiver section of the transceiver 150. The transmit/receive switch 154 is controlled by a signal from the pulse generator module 121 to electrically connect the RF amplifier 151 to the coil 152 during the transmit mode and to connect the preamplifier 153 during the receive mode. The transmit/receive switch 154 also enables a separate RF coil (for example, a head coil or surface coil) to be used in either the transmit or receive mode.

The NMR signals picked up by the RF coil 152 are down converted by an RF reference signal and then digitized by the transceiver module 150. The digitized NMR signal is transferred to a memory module 160 in the system control 122. When the scan is completed and an entire array of k-space NMR data has been acquired in the memory module 160, an array processor 161 operates to Fourier transform the data into an array of image data. This image data is conveyed through the serial link 115 to the computer system 107 where it is stored in the disk memory 111. In response to commands received from the operator console 100, this image data may be archived on the tape drive 112, or it may be further processed by the image processor 106 and conveyed to the operator console 100 and presented on the display 104. For a more detailed description of the transceiver 150, reference is made to U.S. Pat. Nos. 4,952,877 and 4,992,736.

Figure 2:
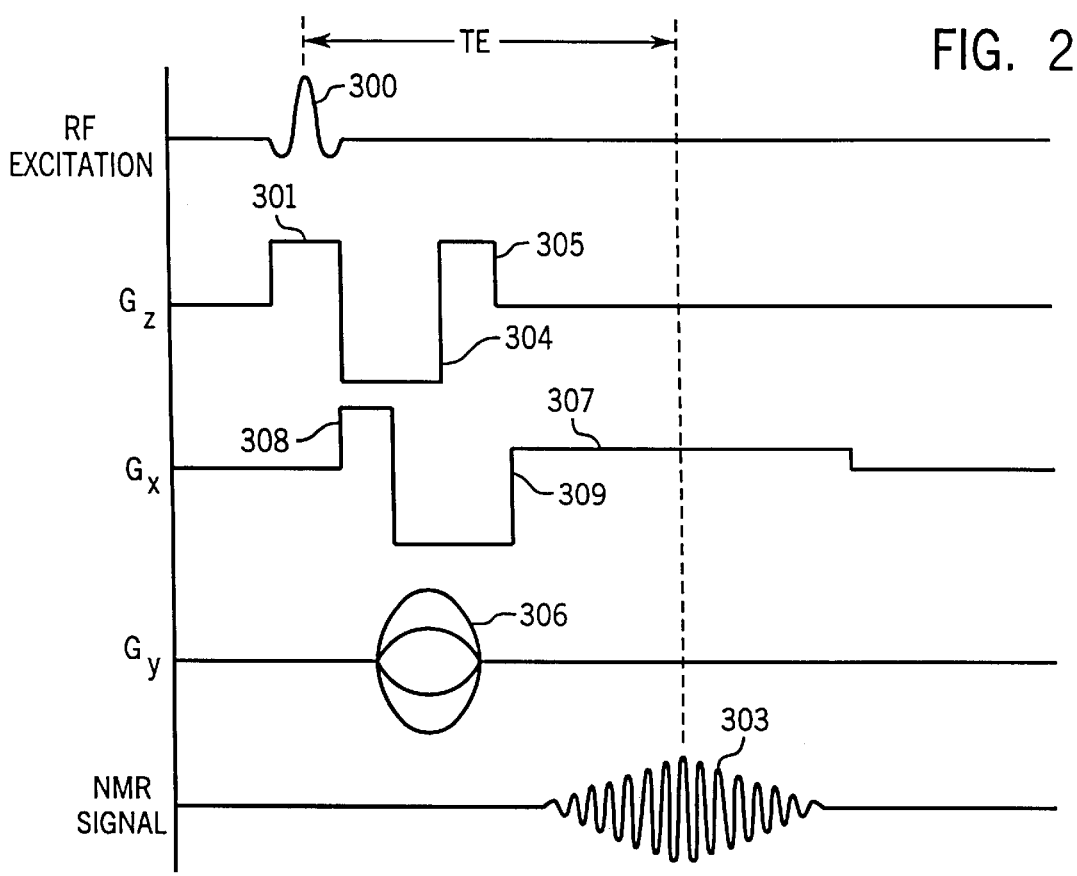
FIG. 2 is an exemplary 3D NMR imaging pulse sequence which may be used when practicing the present invention.

The MRI system of FIG. 1 performs a series of pulse sequences to collect sufficient NMR data to reconstruct the desired image. Referring particularly to FIG. 2, an exemplary 3D gradient recalled echo pulse sequence employs an RF excitation pulse 300 which is applied to the subject in the presence of a $G_z$ slab select gradient pulse 301 to produce transverse magnetization in a selected slab. To compensate the resulting NMR signal 303 for the phase shifts caused by the slab select gradient pulse 301 and to desensitize the NMR signal 303 to velocity along the z-axis, a negative $G_z$ gradient pulse 304 followed by a positive $G_z$ gradient pulse 305 are produced by the $G_z$ gradient coils as taught in U.S. Pat. No. 4,731,583. The gradient pulse 304 has multiple amplitudes and it also provides phase encoding along the z axis direction. While the pulses 304 and 305 compensate for velocity along the z-axis, more complex gradient waveforms are also well known to those skilled in the art for compensating acceleration and even higher orders of motion.

To position encode the NMR signal 303 a phase encoding $G_y$ gradient pulse 306 is applied to the subject shortly after the application of the RF excitation pulse 300. As is well known in the art, a complete scan is comprised of a series of these pulse sequences in which the value of the $G_y$ phase encoding pulse is stepped through a series of, for example, 256 discrete phase encoding values to localize the position of the spins producing the NMR signal along the y-axis. Position along the x-axis is located by a $G_x$ gradient pulse 307 which is produced as the NMR gradient echo signal 303 is acquired and which frequency encodes the NMR signal 303. Unlike the $G_y$ phase encoding gradient pulse 306, the $G_x$ readout gradient pulse 307 remains at a constant value during the acquisition of the NMR signal. To produce the gradient echo 303 and to desensitize it to velocity along the x direction, gradient pulses 308 and 309 precede the gradient pulse 307 as taught in U.S. Pat. No. 4,731,583.

The NMR signal 303 is acquired by the system transceiver 122 and digitized into a row of $N_x$ (e.g. 256) complex numbers which are stored in memory. For each combination of the ($G_y$, $G_z$) phase encoding gradients an NMR signal 303 is produced, acquired, digitized and stored in a separate row of $N_x$ (e.g. 256) complex numbers. At the completion of the scan, therefore, a three-dimensional ($N_x \times N_y \times N_z$) array of k-space data is stored, where $N_y$ is the number of phase encoding steps along the y direction and $N_z$ is the number of phase encoding steps along the z direction. This array of k-space data may be used to reconstruct an image as described above.

It should be apparent to those skilled in the art that many other NMR imaging pulse sequences may be used and that the invention can be applied to both 2DFT and 3DFT acquisitions. The imaging pulse sequence of FIG. 2 is preferred for 3D coronary artery imaging which is the preferred application of the present invention. As will now be described, navigator echo signals are also acquired during the image data acquisition to measure both the displacement and the velocity of subject motion during the scan. This displacement and velocity information may be employed in a number of different ways to reduce the motion artifacts in the image reconstructed from the acquired k-space image data set.

In one embodiment of the invention a conventional navigator pulse sequence is used to measure the location of the patient's diaphragm during each cardiac cycle. This navigator pulse sequence excites a column of spins located at the right side of the abdomen, and transecting the diaphragm near the dome of the liver using a two-dimensional rf excitation pulse. An NMR signal is acquired in the presence of a readout gradient ($G_z$ in the preferred embodiment) directed along the lengthwise dimension of the excited column, and $N_{echo}$ (e.g. 256) samples of the NMR navigator signal are Fourier transformed by the array processor 161. The two-dimensional excitation rf pulse is, for example, a 30 mm diameter excitation which produces a 90° flip angle, although other diameters or flip angles may also be excited. As described, for example, in U.S. Pat. No. 4,812,760, such two-dimensional rf pulses are produced in the presence of two gradient fields ($G_x$ and $G_y$ in the preferred embodiment) and the receiver low pass filter is set for a field of view (e.g. 260 mm) along the excited column (z axis). The NMR signal is sampled at $N_{echo}$ points during a period of, for example, 4 msec. sample period. A reference navigator echo is acquired prior to the acquisition of image data. The reference navigator echo is usually acquired at the end of expiration because the respiratory motion is more stable and reproducible at this position. The displacement between the current diaphragm position and the reference diaphragm position can be measured using the auto-correlation and least mean-squares algorithms as described by Y. Wang et al, "Algorithms for Extracting Motion Information From Navigator Echoes", *Magn. Reson. Med.*, 36:117–123,1996. The diaphragm position can also be measured by using the linear phase shift algorithm disclosed in U.S. Pat. Appin. No. Ser. 08/980,192 filed Nov. 26,1997 by Thomas Kwok-Fah Foo and Kevin F. King.

Figure 3:
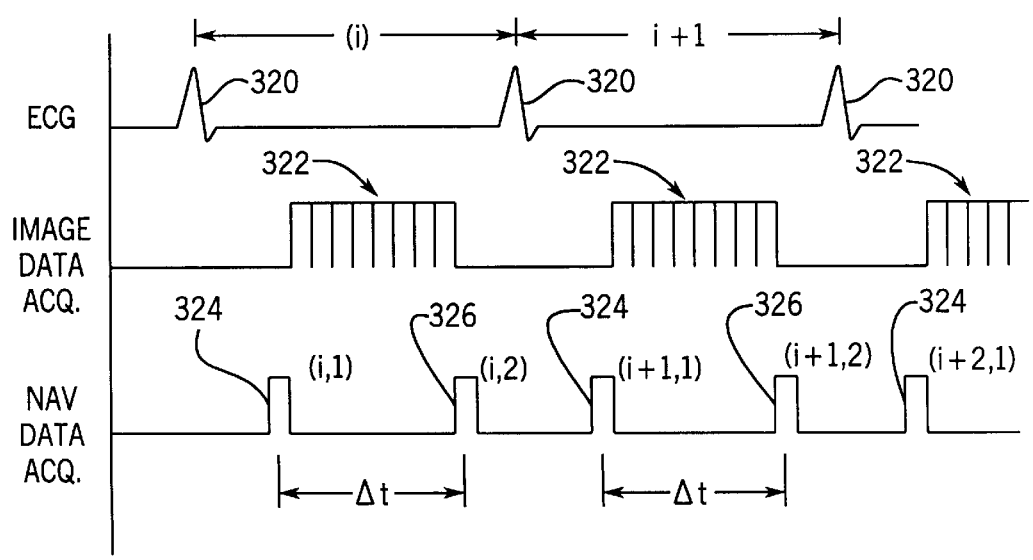
FIG. 3 is a graphic representation of a preferred navigator echo pulse sequence used to practice the present invention.

This conventional navigator pulse sequence is used in a cardiac gated scan as depicted in FIG. 3. The QRS complex 320 of the ECG signal indicates the start of each R-R interval (i through i+n), during which segments 322 of NMR image data are acquired using the imaging pulse sequence of FIG. 2. As is well known in the art, each segment 322 samples a plurality of lines in k-space from one or more slabs through the patient's heart and the acquisitions continue until enough image data has been acquired to reconstruct one or more images.

The navigator pulse sequence is performed twice during each cardiac cycle to measure the location of the patient's diaphragm just prior to each segment 322 acquisition as indicated at 324 and just after each segment acquisition as indicated at 326. The acquired navigator signals 324 and 326 are processed as described above to produce respective diaphragm positions D(i,1) and D(i,2) during each R-R interval i. The time interval Δt between the navigator signal acquisitions 324 and 326 is known, and from this the position information D(i,1) and D(i,2), the diaphragm velocity during the acquisition of each image segment 322 may be calculated:

$$V(i)=[D(i,2)-D(i,1)]/\Delta t,$$

where D(i,1) is the diaphragm position acquired at 324 and D(i,2) is the diaphragm position acquired at 326 during the R-R interval i. As alternatives, navigator signals 324 and 326 can be acquired both prior to each segment 322 acquisition, or both after each segment 322 acquisition.

Figure 4:
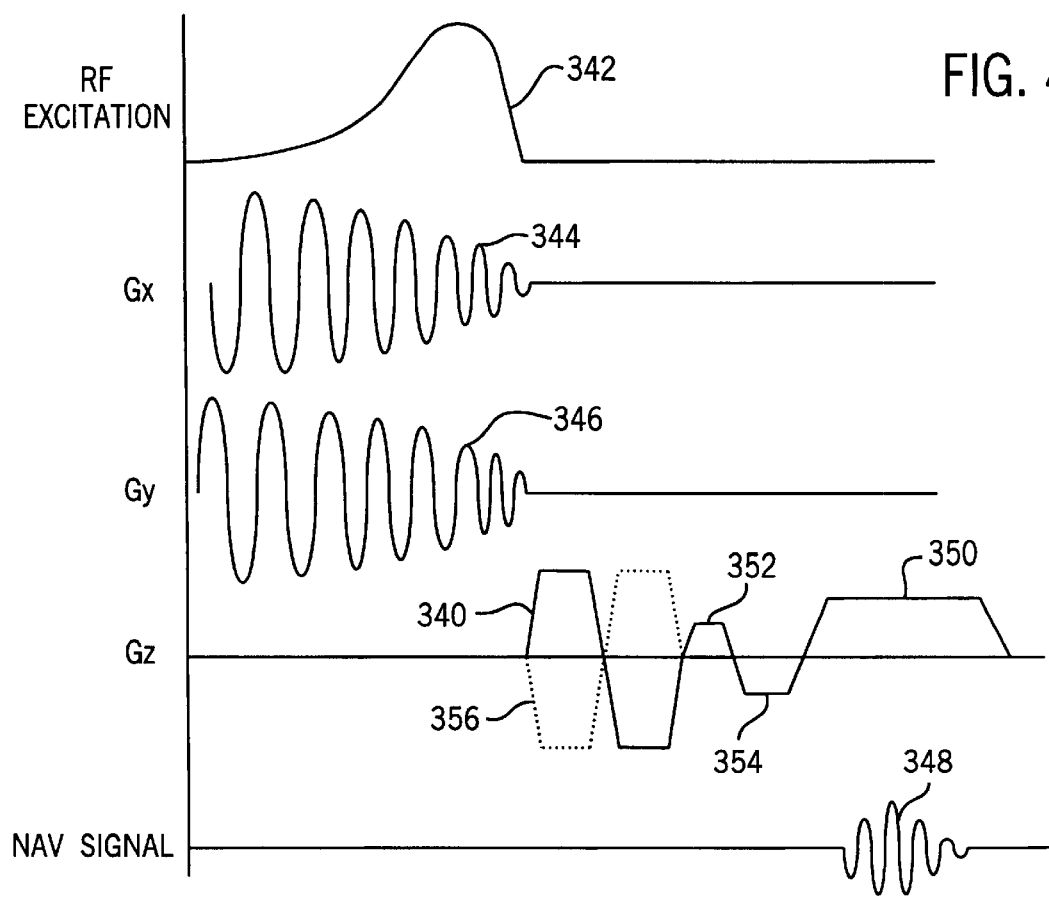
FIG. 4 is a graphic representation of one method of using the navigator pulse sequence of FIG. 3 in combination with the imaging pulse sequence of FIG. 2 to practice the present invention.

In another embodiment of the invention a unique navigator pulse sequence is employed which directly measures both diaphragm position and velocity. This preferred navigator pulse sequence is depicted in FIG. 4, and is distinguished from the conventional navigator pulse sequence described above by the addition of a bi-polar, velocity encoding gradient 340 applied along the readout gradient axis (e.g. $G_z$). This velocity encoding gradient 340 is applied after the transverse magnetization of the column of spins produced by the two-dimensional rf excitation pulse 342 in the presence of two orthogonal gradients 344 and 346. A similar pulse sequence has been used for M-mode flow velocity measurements as described by C. J. Hardy, et al., "*A One-Dimensional Velocity Technique for NMR Measurement of Aortic Distensibility*", *Magn. Reson. Med.*, 31:513–520 (1994). The velocity encoding gradient 340 imposes a phase shift on this transverse magnetization which is proportional to the velocity of spin motion along the readout direction. This phase information is captured when a navigator NMR echo signal 348 is subsequently acquired in the presence of a readout gradient 350 that frequency encodes the acquired signal as a function of spin location along the readout gradient axis (e.g. $G_z$). A pair of readout gradient pulses 352 and 354 are applied just prior to the readout gradient pulse 350 to flow compensate the acquired signal as described in U.S. Pat. No. 4,731,583.

To cancel out phase shifts in the acquired navigator signal 348 due to causes other than spin motion along the readout gradient axis, the navigator pulse sequence of FIG. 4 is repeated with the polarity of the velocity encoding gradient 340 reversed as indicated by dashed lines 356. Two complex navigator profiles are obtained after the inverse Fourier transform of these two navigator signals acquired at opposite velocity encoding polarities: NAV+ and NAV−. The position information is obtained by producing a magnitude profile from one or both complex navigator profiles. The velocity information is obtained by calculating the phase difference of these two complex navigator profiles.

The velocity of the diaphragm is calculated from the signal phase by Velocity=$\phi/\gamma 2M$ where M is the first moment of the velocity encoding gradient 340 and $\gamma$ is the gyromagnetic constant.

Figure 5:
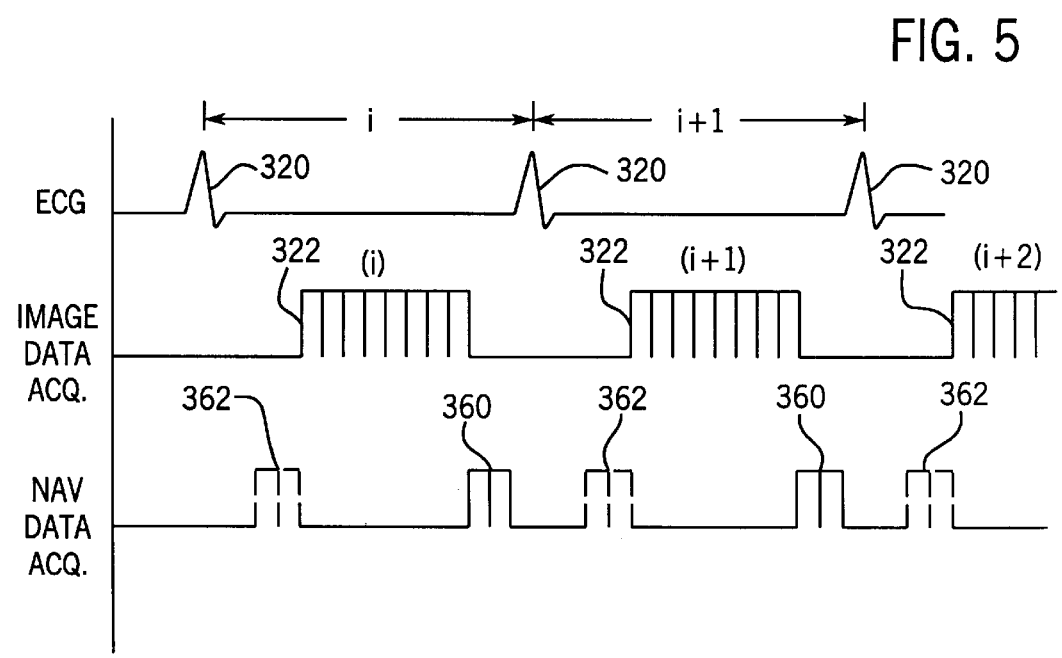
FIG. 5 is a graphic representation of another method of practicing the invention for cardiac imaging.

The velocity encoded navigator pulse sequence pair NAV+ and NAV− is performed during each cardiac cycle to indicate diaphragm location and velocity as each segment 322 is acquired. In the preferred embodiment both NAV+ and NAV− are acquired immediately prior to each image segment 322 as indicated in FIG. 5 by dashed line 362. These navigator acquisitions could also be made just after each segment acquisition 322 as indicated at 360.

Regardless of which navigator pulse sequence is used, the resulting diaphragm position and diaphragm velocity information are used in any of a number of methods to reduce artifacts in the images reconstructed from the acquired image data. Three methods will be described and the choice of which method is used depends on the particular clinical application.

The first method for reducing image artifacts due to the measured position and velocity information is to reject image data that are acquired during certain conditions. More particularly, a position acceptance window is established and if the measured diaphragm position is outside this acceptance window, the acquired image data segment 322 is discarded. Similarly, a velocity acceptance threshold is established and if the absolute value of the measured diaphragm velocity exceeds this threshold, the acquired image data segment 322 is discarded. While this method ensures that corrupted image data is not used in the image reconstruction, the total scan time is increased because the discarded image segments 322 must be re-acquired under acceptable diaphragm motion conditions.

The second method uses the measured position and velocity information to retrospectively correct the acquired image data.

A positional displacement of the heart generates a linear phase error in the consecutive image echoes acquired in the R-R interval. The echo-to-echo phase error, $\Delta F$, is given by:

$$\Delta F = 2\pi * d / \text{slab thickness},$$

where d is the displacement of the heart relative to the reference position. This phase error can be subtracted from the image data before image reconstruction using the navigator measurement of the positional displacement.

The velocity of the heart generates a quadratic phase error in the consecutive echoes acquired in the R-R interval. This quadratic phase error is described in "*Respiratory Blur in 3D Coronary MR Imaging*", *Magn. Reson. Med.*, 33:541–548 (1995) written by Yi Wang, et al. This quadratic phase error can be subtracted from the image data before image reconstruction using the navigator measurement of velocity.

The third method uses the measured diaphragm position and velocity information to prospectively correct the acquired image data. Referring to FIG. 5, in this embodiment the navigator signals are acquired before the image data segments 322 as indicated at 362. The phase corrections required to compensate for the positional displacement and velocity motion are calculated as described above for the second correction method. This phase correction is performed by applying to the NMR signal receiver in the transceiver module 150 a negated phase error immediately prior to the acquisition of the image data segments 322. The phase errors caused by respiratory motion are thus corrected in the received NMR signal prior to image reconstruction. This method is applicable only when the position and velocity measurement are both performed prior to the acquisition of image data segments 322.

It should be apparent that there are many variations possible from the preferred embodiments described above without departing from the spirit of the invention. For example, more than one correction method may be used during a scan. The first method may be used to discard some image data which is too corrupted to be corrected, and then method two or method three may be used to correct the phase of the acquired data.

What is claimed is:

1. A method for producing an MR image of a subject with an MRI system, the steps comprising:
   a) performing a series of imaging pulse sequences with the MRI system to acquire a corresponding series of NMR signals;
   b) performing a series of navigator pulse sequences with the MRI system which are interleaved with the imaging pulse sequences and which produce NMR navigator signals indicative of subject position and subject velocity;
   c) altering the series of NMR signals using the subject position and subject velocity information in the navigator signals such that image artifacts caused by subject motion during the performance of step a) are reduced; and
   d) reconstructing an MR image from the altered series of NMR signals.

2. The method as recited in claim 1 in which the navigator pulse sequence is performed by the MRI system and includes:
   i) producing an rf excitation pulse which produces transverse magnetization in spins located in the subject;
   ii) producing a velocity encoding magnetic field gradient which imparts a phase shift in the transverse magnetization of moving spins;
   iii) producing a readout magnetic field gradient; and
   iv) acquiring the navigator signal as the readout magnetic field gradient is produced.

3. The method as recited in claim 2 in which the velocity encoding magnetic field gradient is a bi-polar gradient having a first moment M and the navigator pulse sequences are performed in pairs, with one the velocity encoding magnetic field gradient in one of each pair of navigator pulse sequences having a positive first moment +M and the velocity encoding magnetic field gradient in the other of each pair of navigator pulse sequences having a negative first moment −M.

4. The method as recited in claim 3 which includes:

producing a net NMR navigator signal from the NMR navigator signals produced by each of said pairs of navigator pulse sequences.

5. The method as recited in claim 4 which includes:

Fourier transforming the NMR navigator signals; and

Calculating the phase difference between two transformed NMR navigator signals to provide the indication of subject velocity.

6. The method as recited in claim 5 which includes:

calculating the magnitude of the transformed NMR navigator signals; and detecting the location of a selected structure in the calculated magnitude NMR navigator signals to provide the indication of subject position.

7. The method as recited in claim 6 in which the subject is a human and the selected structure is a diaphragm or a heart in the human subject.

8. The method as recited in claim 7 in which the NMR signals acquired in step a) are from a heart in the human subject and the MR image reconstructed in step d) depicts the heart.

9. The method as recited in claim 8 in which the alteration of the series of NMR signals in step c) reduces image artifacts caused by respiratory motion.

10. The method as recited in claim 1 in which the navigator pulse sequences are performed in pairs and the time interval between the navigator pulse sequences in each pair is set at a preselected value $\Delta t$.

11. The method as recited in claim 10 in which the subject velocity is indicated by the change in subject position in each pair of navigator pulse sequences divided by the preselected value $\Delta t$.

12. The method as recited in claim 11 which includes:

Fourier transforming each NMR navigator signal;

calculating the magnitude of each transformed NMR navigator signal; and detecting the location of a selected structure in the calculated magnitude NMR navigator signal to provide the indication of subject position.

13. The method as recited in claim 12 in which the subject is a human and the selected structure is a diaphragm or a heart in the human subject.

14. The method as recited in claim 13 in which the NMR signals acquired in step a) are from a heart in the human subject and the MR image reconstructed in step d) depicts the heart.

15. The method as recited in claim 14 in which the alteration of the series of NMR signals in step c) reduces image artifacts caused by respiratory motion.

16. The method as recited in claim 11 in which step c) includes:

rejecting NMR signals acquired when the absolute value of the velocity of the subject exceeds a preselected value.

17. The method as recited in claim 16 in which step c) also includes:

rejecting NMR signals acquired when the subject position is outside the preselected range of positions.

18. The method as recited in claim 17 in which the subject is a human and the position and velocity are indicative of motion of a diaphragm or a heart.

19. The method as recited in claim 18 in which the MR image depicts a heart.

20. The method as recited in claim 1 which includes:

calculating phase corrections from the NMR navigator signals; and altering the series of NMR signals in step c) by changing the phases of NMR signal with the corresponding calculated phase corrections.

21. The method as recited in claim 20 in which the phases of NMR signals are changed by altering the phase of an NMR signal receiver prior to acquiring the NMR signals.

22. The method as recited in claim 20 in which the phases of NMR signals are changed by shifting the phase of each NMR signal after it is acquired.

* * * * *